United States Patent
Huang et al.

(10) Patent No.: US 8,629,534 B2
(45) Date of Patent: Jan. 14, 2014

(54) SEMICONDUCTOR STRUCTURE HAVING LOW THERMAL STRESS

(71) Applicant: Advanced Optoelectronic Technology, Inc., Hsinchu Hsien (TW)

(72) Inventors: Shih-Cheng Huang, Hsinchu (TW); Po-Min Tu, Hsinchu (TW); Shun-Kuei Yang, Hsinchu (TW); Chia-Hung Huang, Hsinchu (TW)

(73) Assignee: Advanced Optoelectronics Technology, Inc., Hsinchu Hsien (TW)

( * ) Notice: Subject to any disclaimer, the term of this patent is extended or adjusted under 35 U.S.C. 154(b) by 0 days.

(21) Appl. No.: 13/926,419

(22) Filed: Jun. 25, 2013

(65) Prior Publication Data

US 2013/0285216 A1    Oct. 31, 2013

Related U.S. Application Data

(62) Division of application No. 12/975,235, filed on Dec. 21, 2010, now Pat. No. 8,501,582.

(30) Foreign Application Priority Data

Jul. 5, 2010    (CN) .......................... 2010 1 02175750

(51) Int. Cl.
    *H01L 29/06*      (2006.01)

(52) U.S. Cl.
    USPC .............................. 257/623; 438/41; 438/429

(58) Field of Classification Search
    USPC ...................................... 257/623; 438/41, 429
    See application file for complete search history.

(56) References Cited

U.S. PATENT DOCUMENTS

| | | | |
|---|---|---|---|
| 2003/0134446 A1* | 7/2003 | Koike et al. ..................... 438/41 |
| 2004/0147096 A1* | 7/2004 | Kitaoka et al. ................ 438/483 |
| 2004/0183090 A1* | 9/2004 | Kitaoka et al. ................ 257/103 |
| 2005/0014363 A1* | 1/2005 | Lee ................................ 438/653 |
| 2005/0277236 A1* | 12/2005 | Shimomura et al. .......... 438/166 |
| 2010/0065854 A1* | 3/2010 | Kamber et al. .................. 257/76 |
| 2010/0327228 A1* | 12/2010 | Bando et al. ............ 252/301.4 R |
| 2011/0073838 A1* | 3/2011 | Khan et al. ...................... 257/13 |

FOREIGN PATENT DOCUMENTS

CN      101599466 A      12/2009

\* cited by examiner

*Primary Examiner* — Jarrett Stark
*Assistant Examiner* — John M Parker
(74) *Attorney, Agent, or Firm* — Altis Law Group, Inc.

(57) ABSTRACT

A semiconductor structure includes a Si substrate, a supporting layer and a blocking layer formed on the substrate and an epitaxy layer formed on the supporting layer. The supporting layer defines a plurality of grooves therein to receive the blocking layer. The epitaxy layer is grown from the supporting layer. A plurality of slots is defined in the epitaxy layer and over the blocking layer. The epitaxy layer includes an N-type semiconductor layer, a light-emitting layer and a P-type semiconductor layer.

11 Claims, 7 Drawing Sheets

SEMICONDUCTOR STRUCTURE HAVING LOW THERMAL STRESS

CROSS-REFERENCE TO RELATED APPLICATION

This patent application is a divisional application of patent application Ser. No. 12/975,235, filed on Dec. 21, 2010, entitled "SEMICONDUCTOR STRUCTURE HAVING LOW THERMAL STRESS AND METHOD FOR MANUFACTURING THEREOF", which is assigned to the same assignee as the present application, and which is based on and claims priority from Chinese Patent Application No. 201010217575.0 filed in China on Jul. 05, 2010. The disclosures of patent application Ser. No. 12/975,235 and the Chinese Patent Application No. 201010217575.0 are incorporated herein by reference in their entirety.

Background

1. Technical Field

The present disclosure relates to a semiconductor structure and a method for manufacturing thereof, and more particularly, to a semiconductor structure having low thermal stress and a method for manufacturing thereof.

2. Description of Related Art

As new type light source, LEDs are widely used in various applications. An LED often includes an LED chip to emit light. A conventional LED chip includes a substrate, an N-type semiconductor layer, a light-emitting layer and a P-type semiconductor layer sequentially grown on the substrate. The substrate is generally made of sapphire ($Al_2O_3$) for providing growing environment to the layers. However, such sapphire substrate has a low heat conductive capability, causing that heat generated by the layers cannot be timely dissipated. Therefore, a new type substrate made of Si is developed. Such Si substrate has a heat conductive index larger than the sapphire substrate so that the heat generated by the layers can be effectively removed.

Nevertheless, the coefficient of thermal expansion (CTE) of the Si substrate does not well match with that of the layers. Thus, during operation of the LED chip, the Si substrate has a deformation different from that of the layers, resulting in a thermal stress concentrated at an interface between the substrate and the layers. Such concentrated thermal stress may cause fracture of the layers or even damage of the LED chip.

What is needed, therefore, is a semiconductor structure which can overcome the limitations described above.

BRIEF DESCRIPTION OF THE DRAWINGS

Many aspects of the present disclosure can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION OF THE EMBODIMENTS

Figure 1:
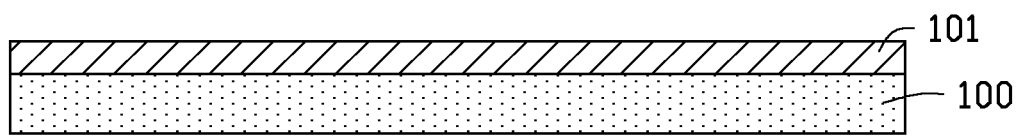
FIG. 1 shows a first process of manufacturing a semiconductor structure of a first embodiment of the present disclosure.
Figure 2:
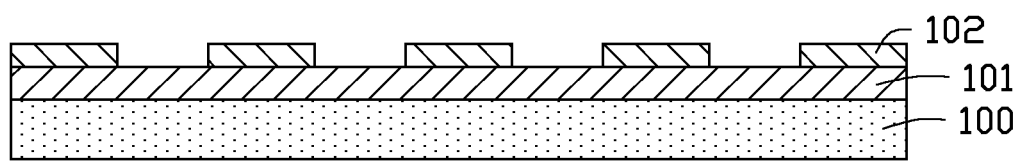
FIG. 2 shows a second process of manufacturing the semiconductor structure of the first embodiment of the present disclosure.
Figure 3:
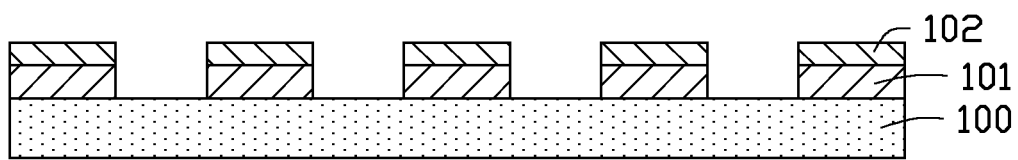
FIG. 3 shows a third process of manufacturing the semiconductor structure of the first embodiment of the present disclosure.
Figure 4:
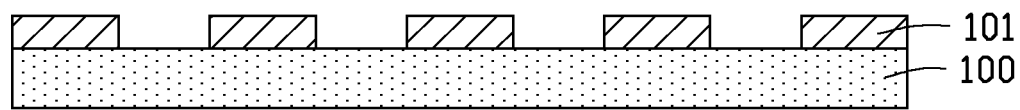
FIG. 4 shows a forth process of manufacturing the semiconductor structure of the first embodiment of the present disclosure.
Figure 5:
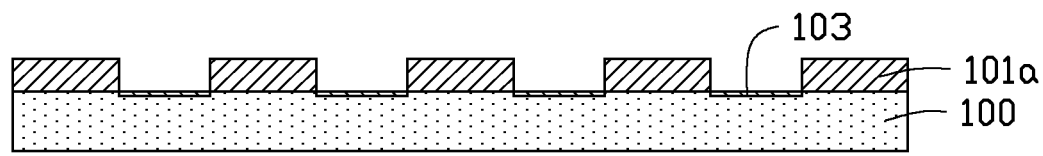
FIG. 5 shows a fifth process of manufacturing the semiconductor structure of the first embodiment of the present disclosure.
Figure 6:
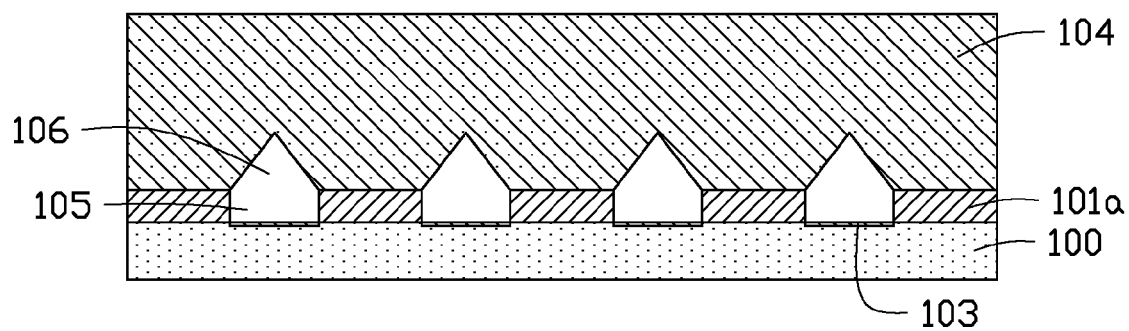
FIG. 6 shows the semiconductor structure of the first embodiment which has been manufactured after the processes of FIGS. 1-5.

Referring to FIG. 6, the present disclosure discloses a semiconductor structure which has a low thermal stress. The semiconductor structure includes a substrate 100, a supporting layer 101a and a blocking layer 103 alternately formed on a top face of the substrate 100 and an epitaxy layer 104 formed on the supporting layer 101a.

The substrate 100 may be made of sapphire, Si, SiC or GaN, wherein Si is preferable in the present disclosure. The material of Si has a heat conductive index larger than that of sapphire so that the substrate 100 can have a better heat conduction capability. The supporting layer 101a may be an AlN or $Al_2O_3$ layer. The supporting layer 101a is divided by multiple grooves 105 to form a plurality of spaced islands. The blocking layer 103 is discontinuously distributed in the grooves 105 to be alternate with the islands of the supporting layer 101a. The blocking layer 103 may be a $SiO_2$ or $Si_3N_4$ layer which has a thickness far less than that of the blocking layer 101a. Preferably, the thickness of the blocking layer 103 is about one-fifth (⅕) of that of the blocking layer 101a. The epitaxy layer 104 includes an N-type semiconductor layer, a light-emitting layer and a P-type semiconductor layer (not shown) sequentially grown from a top face of the supporting layer 101a. The N-type semiconductor layer may be an N-doped GaN, AlGaN, InGaN or AlInGaN layer, the P-type semiconductor layer may be a P-doped GaN, AlGaN, InGaN or AlInGaN layer, and the light-emitting layer may be a multi-quantum well structure. Since the blocking layer 103 prevents the epitaxy layer 104 from growing on a top surface thereof, the epitaxy layer 104 can only be grown on the top face of the supporting layer 101a vertically and upwardly. During vertical growth, the eiptaxy layer 104 also has a lateral growing trend so that discrete parts of the epitaxy layer 104 grown from the top face of the supporting layer 101a would join with each other at places over the blocking layer 103. The epitaxy layer 104 is thus grown to a continuous layer. The epitaxy layer 104 forms a plurality of triangle slots 106 over the blocking layer 103 and communicating with the grooves 105, respectively. Each of the slots 106 has a width gradually decreasing along a direction from the substrate 100 towards the epitaxy layer 104.

Also referring to FIGS. 1-5, a method for manufacturing the above semiconductor structure is given below, including steps:

1) providing a Si substrate 100;

2) forming an aluminum film 101 on the substrate 100, the aluminum film 101 can be formed on the substrate 101 by thermal evaporation, E-beam evaporation, ion-beam sputtering, chemical vapor deposition, physical vapor deposition or electroplating;

3) forming a patterned photoresist layer 102 on the aluminum film 101, the photoresist layer 102 being patterned by lithography to form multiple gapped areas, in which the shapes of the areas can be selected from circle, rectangle, triangle or other suitable shapes, depending on actual requirements;

4) etching the aluminum film 101, wherein since parts of the aluminum film 101 just below the gapped areas of the photoresist layer 102 are protected by the photoresist layer 102, they would not be etched and continue remaining on the top face of the substrate 100; while the other parts of the aluminum film 101 exposed under gaps between the areas of the photoresist layer 102 would be fully etched to expose the top face of the substrate 100;

5) removing the photoresist layer 102 by etching or other methods to expose the remaining aluminum film 101;

6) putting the substrate 100 into a high-temperature environment containing plenty of $O_2$ or $N_2$, in which the aluminum film 101 on the substrate 100 is oxidized or nitrided to $Al_2O_3$ or AlN to thereby form a supporting layer 101a, and the exposed top face of the Si substrate 100 is oxidized or nitrided to $SiO_2$ or $Si_3N_4$ to thereby form a blocking layer 103; and 7) growing an epitaxy layer 104 on the supporting layer 101a.

The temperature of the environment in step 5) can be controlled according to the thickness of the aluminum film 101 and reaction time of the aluminum film 101 and the substrate 100; however, a temperature higher than 1000° C. is preferable in the present disclosure.

Figure 7:
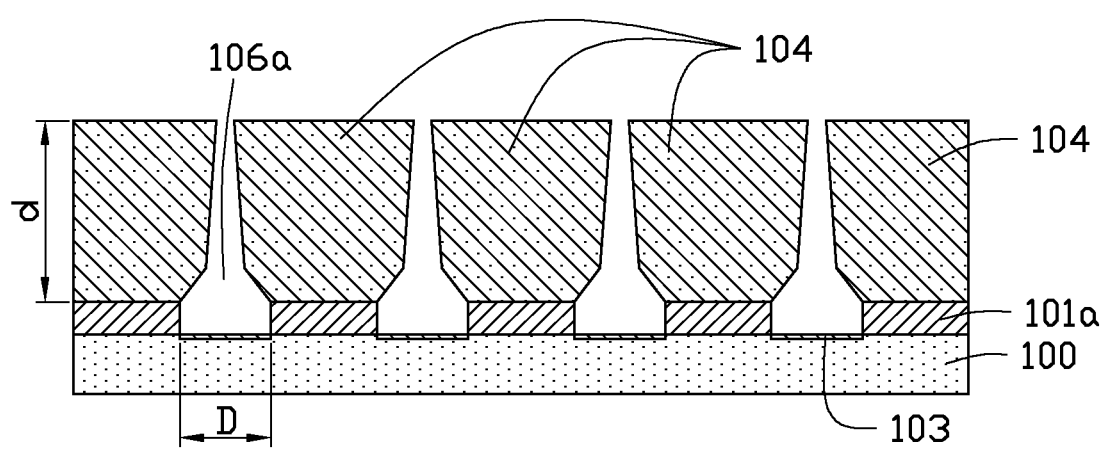
FIG. 7 shows a semiconductor structure of a second embodiment which has been manufactured after the processes of FIGS. 1-5.

Also referring to FIG. 7, by controlling relation between a width D of each groove 105 and a thickness d of the epitaxy layer 104, the lateral growing of the epitaxy layer 104 can be limited to leave the slots 106a extending through the whole epitaxy layer 104. The epitaxy layer 104 is thus divided by the slots 106a to plural of individual islands. Preferably, the width D of each groove 105 and the thickness d of the epitaxy layer 104 should conform to the relation of D>2 d, to realize the separation between the islands of the epitaxy layer 104. Such discrete islands of the epitaxy layer 104 can be directly used as LED chips without further dicing, thereby reducing manufacturing process of the semiconductor structure.

Furthermore, a buffer layer (not shown) can be formed on the top face of the supporting layer 101a before growing the epitaxy layer 104. The buffer layer can provide better growing environment for the epitaxy layer 104 so that less dislocations would be generated within the epitaxy layer 104. The buffer layer can be made of GaN, AN or other suitable materials.

The grooves 105 between bottom areas of the epitaxy layer 104 can effectively relieve concentrated thermal stress between the epitaxy layer 104 and the substrate 100, thereby protecting the epitaxy layer 104 from facture. In addition, since difference of the refractive index between the epitaxy layer 104 and air contained within the slots 106, lateral faces of the epitaxy layer 104 defining the slots 106 can totally reflect more light emitted downwardly from the epitaxy layer 104 towards a top face of the epitaxy layer 104, thereby increasing light-extracting efficiency of the semiconductor structure.

It is believed that the present disclosure and its advantages will be understood from the foregoing description, and it will be apparent that various changes may be made thereto without departing from the spirit and scope of the present disclosure or sacrificing all of its material advantages, the examples hereinbefore described merely being preferred or exemplary embodiments.

What is claimed is:

1. A semiconductor structure comprising:
   a substrate;
   a supporting layer formed on a face of the substrate and consisting of a plurality of discrete islands and a plurality of grooves each between two adjacent islands of the supporting layer;
   a blocking layer formed on the face of the substrate and consisting of a plurality of discrete portions alternate with the islands of the supporting layer; and
   an epitaxy layer formed on the islands of the supporting layer, the epitaxy layer being not in contact with the blocking layer;
   wherein the plurality of grooves are below the epitaxy layer, and the portions of the blocking layer are in the grooves, respectively.

2. The semiconductor structure as claimed in claim 1, wherein the blocking layer has a thickness less than that of the supporting layer.

3. The semiconductor structure as claimed in claim 1, wherein the epitaxy layer has a plurality of slots defined in a bottom face thereof, each of the slots communicating with a corresponding groove.

4. The semiconductor structure as claimed in claim 3, wherein each of the slots has a width gradually decreasing along a direction from the substrate towards the epitaxy layer.

5. The semiconductor structure as claimed in claim 3, wherein each of the slots is terminated within the epitaxy layer.

6. The semiconductor structure as claimed in claim 3, wherein each of the slots is extended through the epitaxy layer to divide the epitaxy layer into a plurality of individual parts.

7. The semiconductor structure as claimed in claim 3, wherein a bottom of each slot has a width equal to a width of each groove.

8. The semiconductor structure as claimed in claim 1, wherein the blocking layer is made of $SiO_2$ or $Si_3N_4$.

9. The semiconductor structure as claimed in claim 1, wherein the supporting layer is made of $Al_2O_3$ or AlN.

10. The semiconductor structure as claimed in claim 1, wherein the substrate is made of Si.

11. The semiconductor structure as claimed in claim 1, wherein a width of each groove is more than twice a thickness of the epitaxy layer.

* * * * *